United States Patent [19]

Ikeda et al.

[11] Patent Number: 5,819,683

[45] Date of Patent: Oct. 13, 1998

[54] TRAP APPARATUS

[75] Inventors: Towl Ikeda, Inba-Gun; Takashi Horiuchi, Nakakoma-Gun, both of Japan

[73] Assignee: Tokyo Electron Limited, Tokyo-to, Japan

[21] Appl. No.: 639,926

[22] Filed: Apr. 26, 1996

[30] Foreign Application Priority Data

May 2, 1995 [JP] Japan .................................. 7-132833

[51] Int. Cl.⁶ .......................... C23C 16/00; B01D 53/34
[52] U.S. Cl. ......................... 118/724; 118/715; 422/168; 422/174
[58] Field of Search .................................. 118/715, 724; 422/168, 174

[56] References Cited

U.S. PATENT DOCUMENTS

| | | | |
|---|---|---|---|
| 4,753,192 | 6/1988 | Goldsmith et al. | 118/724 |
| 4,940,213 | 7/1990 | Ohmine et al. | 118/715 |
| 5,030,476 | 7/1991 | Okamura et al. | 118/724 |
| 5,084,080 | 1/1992 | Hirase et al. | 422/174 |
| 5,405,445 | 4/1995 | Kumada et al. | 118/715 |

FOREIGN PATENT DOCUMENTS

| | | | |
|---|---|---|---|
| 0 382 984 A1 | 8/1990 | European Pat. Off. | 422/168 |
| 216 637 A1 | 12/1984 | German Dem. Rep. | 422/174 |
| 60-1827 | 1/1985 | Japan | 118/724 |
| 60-234313 | 11/1985 | Japan | 118/724 |
| 62-7120 | 1/1987 | Japan . | |
| 63-291893 | 11/1987 | Japan | 118/724 |
| 63-28869 | 2/1988 | Japan | 118/723 ER |
| 1-53075 | 3/1989 | Japan . | |
| 4-136175 | 11/1992 | Japan . | |
| 8-24503 | 1/1996 | Japan . | |

*Primary Examiner*—R. Brue Breneman
*Assistant Examiner*—Jeff Lund
*Attorney, Agent, or Firm*—Beveridge, DeGrandi, Weilacher & Young, LLP

[57] ABSTRACT

There is provided a trap apparatus, which is inserted in a vacuum exhaust system sucking and discharging an exhaust gas from a process apparatus by a vacuum pump, for trapping a tramp material contained in the exhaust gas, said trap apparatus comprising, a trapping passage container inserted in the exhaust passage, at the upstream side of the vacuum pump, and a heating trap, housed in the trapping passage container, for heating the exhaust gas to a predetermined temperature while the heating trap is brought into contact with the exhaust gas flowing, thereby subjecting the tramp material in the exhaust gas to pyrolysis. Thus, the unaffected process gas circulated through the exhaust passage is touched by the heating trap and pyrolytically decomposed, and separated metal adheres to the heating trap so as to be trapped thereby. The heating trap is formed of an electric heating coil formed spirally so as to define a gap between the wire thereof, so that the electric heating coil can be sufficiently brought into contact with the exhaust gas and the exhaust gas is allowed to flow through the gaps between the wires. Therefore, the area that the exhaust gas is brought into contact with the wires of the electric heating coil becomes larger, and the exhaust gas can flow through the gaps to secure the flowing conductance. As a result, a balance of the contact area and the flowing conductance is maintained.

9 Claims, 7 Drawing Sheets

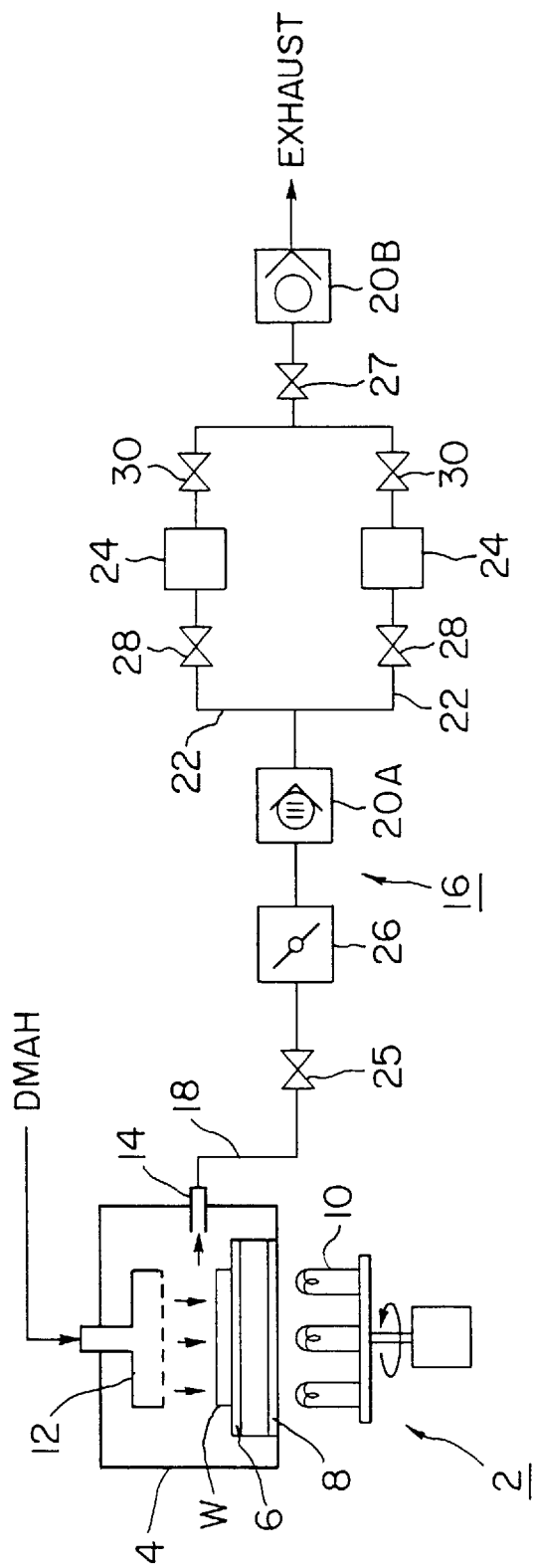
F I G. 1

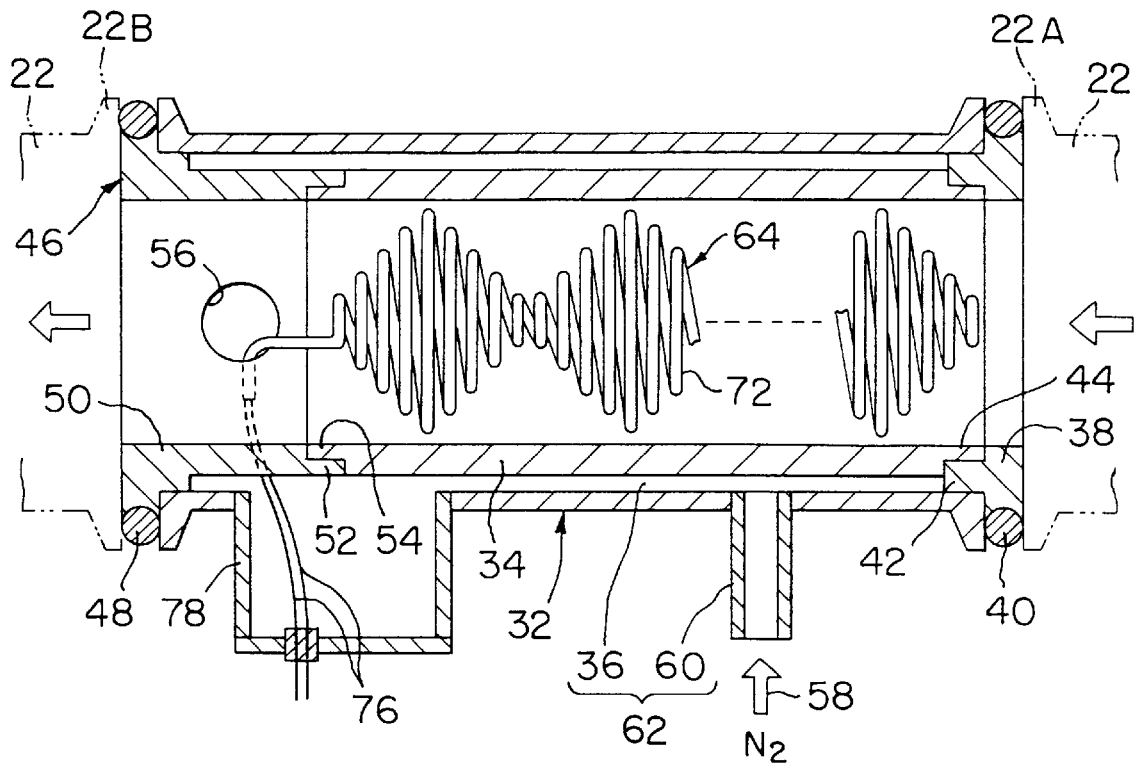
F I G. 2
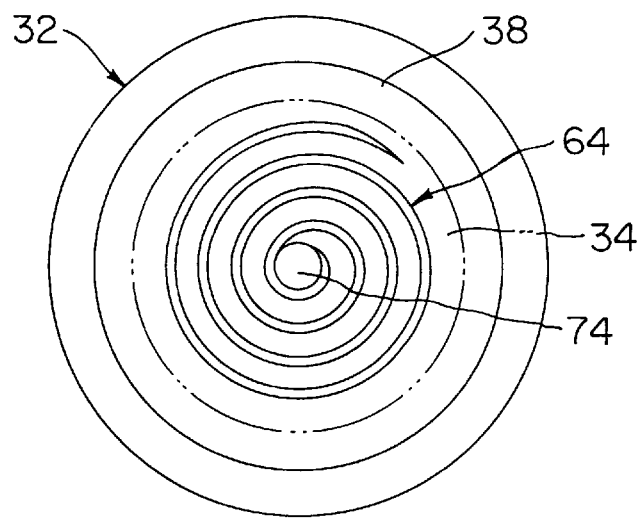
F I G. 3

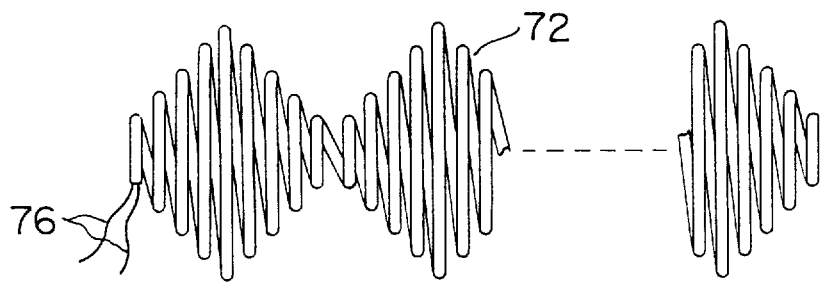
F I G. 5
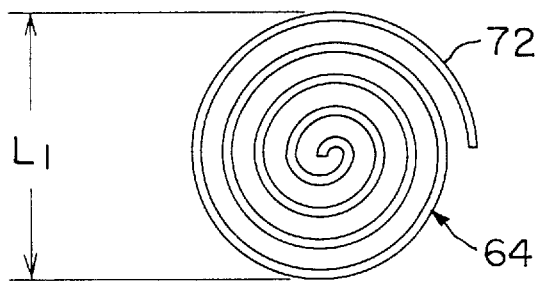
F I G. 6
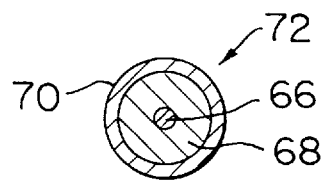
F I G. 7

TRAP APPARATUS

BACKGROUND OF THE INVENTION

1. Field of the Invention

The present invention relates to a trap apparatus decomposing and removing tramp materials, for example, unaffected gases discharged from a metal CVD apparatus or the like.

2. Information of the Related Art

In manufacturing a semiconductor integrated circuit or the like, desired circuit elements are generally arranged by repeatedly subjecting a substrate to film deposition and pattern etching. Many of various process gases which are used in processes for film deposition and etching are more or less injurious. Therefore, exhaust gas from a process container are discharged into the atmosphere after unaffected process gases therein are trapped by means of a removing or trap apparatus.

In the case of a metal CVD (chemical vapor deposition) apparatus which forms a metallic film of aluminum or tungsten on a substrate, for example, an organic material which contains a metal to be deposited in the form of a film is used as a process gas, and an exhaust system is provided with a trap apparatus for removing the unaffected process gas. The process container is evacuated to a predetermined pressure by means of vacuum pumps which are located on the downstream side of the trap apparatus.

The vacuum pumps include a pump for rough evacuation, which is used to evacuate the container under atmospheric pressure to a certain degree of vacuum, e.g., several Torrs, and a pump for precision evacuation, which is actuated to evacuate the container to a higher degree of vacuum when the certain degree of vacuum is reached. In general, these two pumps of different types are alternatively used to obtain a high degree of vacuum and maintain a desired pressure condition.

Conventionally, a mechanical pump, such as a rotary pump which uses oil, e.g., lubricating oil, is mainly employed as the pump for rough evacuation. In this case, some of the oil, although little, flows backward in the exhaust system and gets into the process container, so that the yield of production of semiconductor devices is lowered. To avoid this adverse effect, therefore, there is now a tendency for use of the so-called dry pumps which use no oil.

In the trap apparatus which removes the unaffected process gas in the exhaust gas, an unaffected substance is generally removed by being cooled and solidified. However, some kinds of process gases cannot be removed by cooling, but can be removed by heating or pyrolysis.

For example, dimethyl aluminum hydride (DMAH; $(CH_3)_2AlH$) or the like, which is used as a process gas for the deposition of an aluminum film, cannot be removed by cooling, but is thoroughly decomposed into elements including aluminum, hydrogen, and methane or ethane when it is heated to 150° to 500 ° C.

The mechanical pump, which includes mechanical contact portions, for example, is locally subjected to a considerably high temperature even though it is cooled. In some cases, the unaffected process gas may be pyrolytically decomposed so that aluminum is separated therefrom when touched by the heated portions of the pump. In the worst case, the pump could be broken.

The aforesaid DMAH starts to be gradually decomposed at a temperature of 80° C. or thereabout even though the temperature of the mechanical contact portions is not as high as 150° C. Accordingly, there is a demand for satisfactory measures to remove the unaffected DMAH securely without exerting a bad influence upon the pump.

SUMMARY OF THE INVENTION

The object of the present invention is to provide a trap apparatus, which can securely remove an unaffected process gas decomposed by heat, without adversely effecting a vacuum pump.

In order to achieve the above object, according to the present invention, there is provided a trap apparatus, which is inserted in a vacuum exhaust system sucking and discharging an exhaust gas from a process apparatus by a vacuum pump, for trapping a tramp material contained in the exhaust gas, said trap apparatus comprising, a trapping passage container inserted in the exhaust passage, at the upstream side of the vacuum pump, and heating trap means, housed in the trapping passage container, for heating the exhaust gas to a predetermined temperature while the heating trap means is brought into contact with the exhaust gas flowing, thereby subjecting the tramp material in the exhaust gas to pyrolysis.

Thus, according to the present invention, the unaffected process gas circulated through the exhaust passage is touched by the heating trap means in the trapping passage container and pyrolytically decomposed, and separated metal adheres to the heating trap means so as to be trapped thereby.

In this case, the heating trap means is formed of an electric heating coil formed spirally so as to define a gap between the wire thereof, so that the electric heating coil can be sufficiently brought into contact with the exhaust gas and the exhaust gas is allowed to flow through the gap between the wire. Therefore, the area that the exhaust gas is brought into contact with the wire of the electric heating coil is made larger, while the exhaust gas can flow through the gap to secure the flowing conductance. As a result, a balance of the contact area and the flowing conductance is maintained.

Also, the heating trap means, as alternative to the electric heating coil, may be formed of heating trap baffle plates, which are arranged at predetermined pitches along a flow of the gas.

In order to prevent the inner wall of the trapping passage container from being heated, moreover, the container may be provided with cooling means including an inert gas, whereby an operator can enjoy a safe operation without the possibility of suffering a burn.

Since the trap apparatus is located on the upstream side of the vacuum pump means in the exhaust passage of the process apparatus, the unaffected process gas can be removed securely. Thus, the metal produced by the decomposition can be prevented from depositing on the vacuum pump means on the downstream side.

Furthermore, the exhaust passage may be formed with a plurality of branch exhaust passages. In this case, the aforesaid trap apparatus is provided in each of the branch exhaust passages for alternative use. Thus, the trap apparatuses can be subjected to maintenance operation without suspending the operation of the process apparatus.

BRIEF DESCRIPTION OF THE DRAWINGS

FIG. 1 is a diagram showing an unaffected process gas exhaust mechanism according to the present invention, which is connected to a process apparatus;

FIG. 2 is a partial sectional view of a trap apparatus according to the invention used in the exhaust mechanism shown in FIG. 1;

FIG. 3 is a side view of the trap apparatus shown in FIG. 2;

FIG. 5 is a plan view showing heating trap means;

FIG. 6 is a side view of the heating trap means shown in FIG. 5;

FIG. 7 is an enlarged sectional view of an electric heating coil of the heating trap means shown in FIG. 5;

DETAILED DESCRIPTION OF THE PREFERRED EMBODIMENTS

Figure 4:
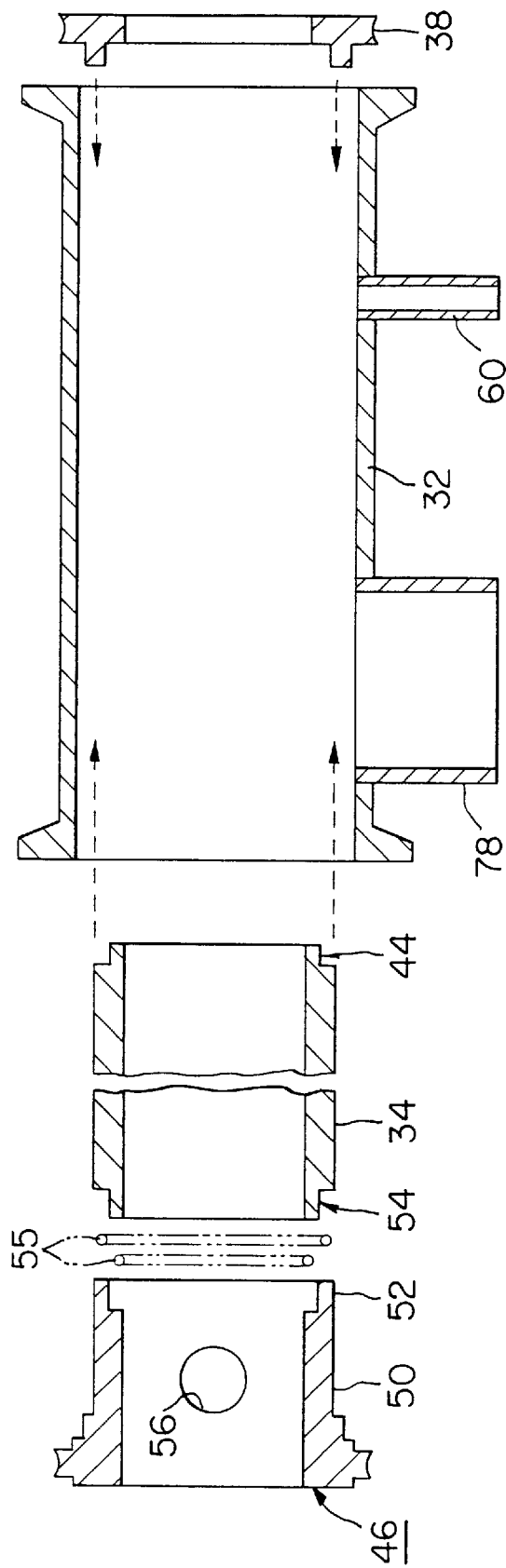
FIG. 4 is an exploded view of the trap apparatus shown in FIG. 2.

A trap apparatus according to the present invention and an embodiment of an unaffected process gas exhaust mechanism using the same will now be described with reference to the accompanying drawings.

According to the present embodiment, a metal CVD apparatus for forming, for example, a metallic film on a semiconductor wafer is used as the process apparatus to which the unaffected process gas exhaust mechanism is connected.

As shown in FIG. 1, the metal CVD apparatus 2 comprises a process container 4 which contains, for example, a graphite stage 6 bearing thereon a semiconductor wafer W as an object to be treated. A plurality of heater lamps 10 are arranged for rotation under the stage 6. Interposed between the stage 6 and the lamps 10 is a transparent window 8 of quartz glass, which hermetically seals the container 4.

The process container 4 contains a shower head 12, which faces the stage 6 and is used to supply a process gas. In forming a metallic film of aluminum on the wafer surface, for example, DMAH, which can be decomposed by heat of about 150° to 200° C., is used as the process gas.

The process container 4 is provided with an exhaust port 14 through which an atmosphere in the container is discharged. The unaffected process gas exhaust mechanism 16 according to the present invention is connected to the exhaust port 14. The exhaust mechanism 16 mainly comprises an exhaust pipe 18 of, for example, aluminum or stainless steel having a diameter of about 40 to 100 mm, two vacuum pumps 20A and 20B in the middle of the pipe 18, and two trap apparatuses 24 according to the invention. The trap apparatuses 24 are inserted individually in branch exhaust pipes 22, which are formed by branching the exhaust pipe 18 in parallel relation.

More specifically, the exhaust pipe 18 is provided with a gate valve 25 for open-close operation only, a conductance valve 26 for aperture ratio adjustment, the first vacuum pump 20A, the trap apparatuses 24, a gate valve 27, and the second vacuum pump 20B, which are arranged from the upstream side of the exhaust pipe 18 to the downstream side. For example, the first pump 20A is formed of a turbo molecular pump for precision evacuation which is based on the magnetic floating system and includes no mechanical contact portions. The second pump 20B is formed of a dry pump for rough evacuation which uses no oil. The branch exhaust pipes 22 on the up- and downstream sides of the trap apparatuses 24 are fitted individually with upstream-side on-off valves 28 and downstream-side on-off valves 30, whereby the units 24 are independently connected to and from an exhaust system. If the first vacuum pump 20A is a turbo molecular pump which includes mechanical contact portions such as ball bearings, it may possibly be subjected to mechanical damage by separated aluminum. Therefore, the pump 20A is located on the downstream side of the trap apparatuses 24.

The following is a description of the trap apparatuses 24 which are inserted in the branch exhaust pipes 22. These two units 24 are constructed just in the same manner, and each branch exhaust pipe 22 is formed of a stainless steel or aluminum pipe with an inside diameter of about 40 to 100 mm, for example. Each trap apparatus 24 includes a trapping passage container 32 in the form of a stainless-steel or aluminum cylinder, which has the same diameter as each branch exhaust pipe. In FIG. 1, each trap apparatus 24 is illustrated in the form of a square box in order to define its position. As shown in FIGS. 2 to 4, an insulating cylinder 34 of a heat insulating material, such as ceramics, is housed in the trapping passage container 32, thus constituting a dual pipe structure. The outside diameter of the insulating cylinder 34 is smaller than the inside diameter of the container 32 by a small margin, e.g., 4 mm or thereabout. A ring-shaped gap of about 2 mm is provided between the outer wall surface of the insulating cylinder 34 and the inner wall surface of the passage container 32, thus forming a refrigerant passage 36 through which a refrigerant flows in the manner mentioned later.

An upstream-side mounting ring 38 of, for example, stainless steel is fitted in the upstream-side end portion of the trapping passage container 32 in a manner such that its end portion projects. The upstream-side end portion of the container 32 and a mounting portion 22A of the upstream-side branch exhaust pipe 22 are removably attached to each other in an airtight manner by means of bolts (not shown) or the like, with a seal member 40, such as an O-ring, fitted on the end portion of the ring 38. The upstream-side mounting ring 38 is provided with a ring-shaped insulating cylinder supporting portion 42 which substantially touches the end portion of the passage container 32 internally. An upstream-side retaining step portion 44, which is formed on one end portion of the insulating cylinder 34, is fitted in the supporting portion 42, thereby holding it in position. Thus, the upstream-side end of the refrigerant passage 36 is securely sealed by means of the mounting ring 38, seal member 40, etc. lest exhaust gas flow into the passage 36.

Figure 8:
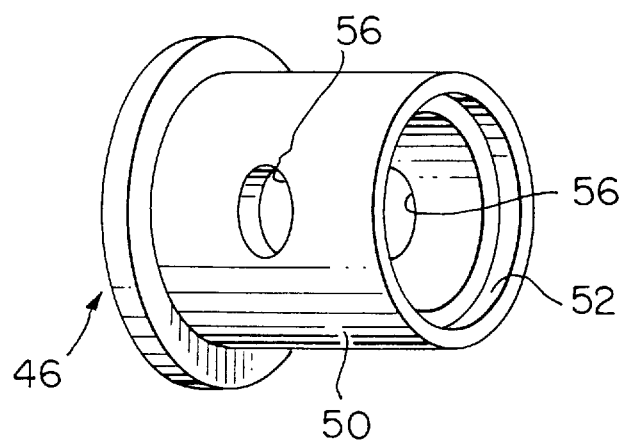
FIG. 8 is a perspective view showing a downstream-side mounting ring.

On the other hand, a downstream-side mounting ring 46 of stainless steel or the like is fitted in the downstream-side end portion of the trapping passage container 32 in a manner such that its end portion projects. The downstream-side end portion of the container 32 and a mounting portion 22B of the downstream-side branch exhaust pipe 22 are removably attached to each other in an airtight manner by means of bolts (not shown) or the like, with a seal member 48, such as an O-ring, fitted on the end portion of the ring 46. FIG. 8 is a perspective view of the upstream-side mounting ring 46. The mounting ring 46 includes a ring body 50, which has substantially the same outside diameter as the insulating cylinder 34 and is adapted to be inserted in the container 32. A stepped insulating cylinder supporting portion 52 is formed on the extreme end portion of the ring body 50. A downstream-side retaining step portion 54, which is formed on the other end portion of the insulating cylinder 34, is fitted in the supporting portion 52, thereby supporting the other end side of the cylinder 34. In this case, the sealing properties in- and outside the insulating cylinder 34 can be secured and dimensional errors can be absorbed by interposing seal members 55, such as O-rings, between the supporting portion 52 and the step portion 54, as shown in FIG. 4.

The ring body 50 of the downstream-side mounting ring 46 is formed with a plurality of communication holes 56 (two in number in the illustrated example) for connecting the inside of the insulating cylinder 34, through which an unaffected gas flows practically, and the refrigerant passage 36, which is a gap defined outside the cylinder 34.

The upstream-side wall of the trapping passage container 32 is formed with a refrigerant inlet 60 through which a refrigerant 58, e.g., cooled nitrogen gas or other inert gas, is introduced into the refrigerant passage 36. The refrigerant 58 is used to cool the respective wall surfaces of the passage container 32 and the insulating cylinder 34. Finally, the introduced refrigerant gas is delivered into the exhaust gas through the communication holes 56 in the ring body 50. The refrigerant passage 32 and the refrigerant inlet 60 constitute cooling means 62.

Arranged in the insulating cylinder 34 is heating trap means 64 for practically trapping the unaffected process gas in the exhaust gas. The heating trap means 64 is formed of an electric heating coil 72 which generates heat when energized. The heating coil 72 may, for example, be a SHEATH HEATER (trademark) which comprises a heating wire 66 in the center, an insulating material 68, such as magnesium oxide, surrounding the wire 66, and a coating film 70, e.g., a thin stainless film, covering the material 68.

The heating coil 72 is formed in a shape of spiral so that the diameter thereof is gradually made larger and then is gradually made smaller, as shown in FIGS. 5 and 6. Therefore, a gap is defined between each wire of the coil 72. Thus, the area that the exhaust gas is brought into contact with the wires of the electric heating coil 72 is made larger, while the exhaust gas can flow through the gaps to secure the flowing conductance. As a result, a balance of the contact area and the flowing conductance is maintained.

In FIG. 5, the spiral structure of the coil includes a plurality of spirals as a whole. In this case, the diameter L1 of the heating trap means 64 is set so as to be substantially equal to the inside diameter of the insulating cylinder 34. Thus, the trap means 64 is formed substantially covering the entire flow area, as shown in FIG. 3, so that its area of contact with the unaffected process gas is increased to enhance the trapping efficiency. In this case, a straight passage is inevitably formed in the center of the heating trap means 64 which is obtained by twisting the heating coil 72. Therefore, an optically blind state is secured with respect to the flowing direction of the gas by previously passing a blocking rod 74 through the passage in the gas flowing direction.

Lead wires 76, which extend from the heating trap means 64, are drawn out from the communication holes 56 in the ring body 50 and a power supply port 78 located on the downstream side of the trapping passage container 32, and are connected to the power supply.

It is to be understood that the power supply port 78 allows the lead wires 76 to extend to the outside of the container 32 in an airtight manner.

The following is a description of the operation of the present embodiment constructed in the aforementioned manner.

First, in forming a metallic film of, for example, aluminum by means of the metal CVD apparatus 2, the wafer W placed on the stage 6 is heated to a predetermined process temperature by means of heat from the heater lamps 10, and DMAH gas is introduced as the process gas into the process container 4. At the same time, the vacuum pumps 20A and 20B of the exhaust mechanism 16 are driven to evacuate the container 4, thereby maintaining the process pressure.

The container 4 is evacuated to be kept at the predetermined process pressure during the film forming process. As the container 4 is evacuated in this manner, the unaffected process gas also flows in the exhaust pipe 18.

After passing through the conductance valve 26 and the vacuum pump 20A, which includes no mechanical contact portions, the unaffected process gas flows into one or both of the trap apparatuses 24, whereupon it is pyrolytically decomposed and removed. Provided in the insulating cylinder 34, through which the unaffected gas flows practically, is the heating trap means 64 which is formed of a heating coil such that it substantially covers the entire flow area. Since the trap means 64 is heated to a temperature of, for example, about 200° C. such that the process gas can be substantially pyrolytically decomposed, moreover, the unaffected process gas is reduced to aluminum, hydrogen, methane, etc. when it is brought into contact with the trap means 64.

The gases, such as hydrogen, methane, etc., produced by the pyrolysis flow out directly to the downstream side, and separated aluminum adheres mainly to the surface of the heating coil 72 and is removed. Thus, the separated aluminum can be prevented from flowing to the downstream side and adhering to the inside of the vacuum pump 20B on the downstream side.

The heating temperature of the trap means 64 at this point of time can be settled depending on the temperature for the pyrolysis of the unaffected process gas, and the length of the trap means 64 can be set within a range such that the gas outflow conductance never lowers substantially, in consideration of the trapping efficiency.

In this case, the trap means 64 is provided substantially covering the entire cross section or flow area which is perpendicular to the gas flow, and the blocking rod 74 is passed through the central portion of the trap means 64 to secure the optically blind state with respect to the flowing direction of the gas. Accordingly, the efficiency of contact between the unaffected process gas and the heating coil 72 is so high that the trapping efficiency can be kept on a high level.

Figure 9:
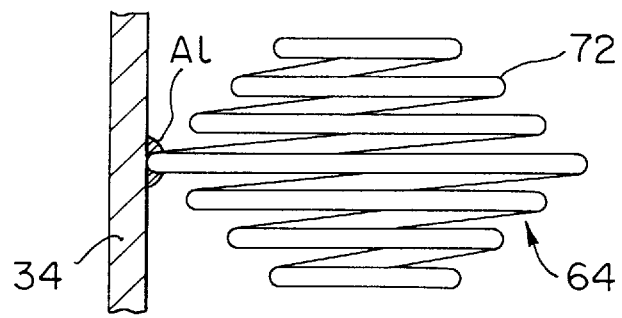
FIG. 9 is a view showing separated metal on a region of contact between an insulating cylinder and the heating coil.

The outer periphery of the heating coil 72 is kept substantially in contact with the inner wall surface of the insulating cylinder 34, and the coil itself is very light in weight, so that it can hardly move inside. As the separation of aluminum advances, the separated aluminum adheres to the region of contact between the inner wall of the insulating cylinder 34 and the heating coil 72, as shown in FIG. 9, thereby solidifying the bond between the two. Thus, the coil itself can be prevented from moving. In this case, the heating coil 72 is expanded by the heat of the exhaust gas and stretches against the inner wall surface of the insulating cylinder 34. Also for this reason, the coil 72 can be prevented from moving.

While the insulating cylinder 34 prevents the heat of the heating coil 72 from being transferred to the trapping passage container 32, the wall surface of the container 32 tends to be heated gradually as the process advances. In the present embodiment, however, the cooling means 62 can protect the wall surface of the passage container 32 against overheating. More specifically, cooled or normal-temperature nitrogen gas, for use as the refrigerant 58, is introduced into the refrigerant passage 36 between the insulating cylinder 34 and the trapping passage container 32 through the refrigerant inlet 60, whereby the respective wall surfaces of the cylinder 34 and the container 32 are cooled, for example, to 50° C. or less. In this case, the refrigerant passage 36 is kept at a considerably high degree of vacuum despite the introduction of the nitrogen gas, so that it can serve also as a vacuum insulating layer. Thus, there is no possibility of an operator's suffering a burn or the like even though the operator touches the trapping passage container 32. Although only one refrigerant inlet 60 is provided in the illustrated example, the insulating cylinder 34 can be efficiently cooled if a plurality of refrigerant inlets are arranged in suitable positions along the circumference of the container 32.

Since the upstream-side end of the refrigerant passage 36 is sealed by means of the upstream-side mounting ring 38 and the like, the nitrogen gas introduced into the passage 36 never flows out therefrom into the unaffected process gas, so that the unaffected gas can be prevented from being diluted to lower the efficiency of contact with the heating trap means 64. On the other hand, the nitrogen gas passed through the refrigerant passage 36 flows into the trapped exhaust gas through the communication holes 56 in the ring body 50. Accordingly, the exhaust gas, produced by the pyrolysis of the DMAH gas and including inflammable hydrogen, methane, etc., is diluted with the nitrogen gas, whereby explosion or the like can be prevented.

Thus, the DMAH gas can be pyrolytically decomposed by means of the trap apparatuses, and the separated aluminum can be removed by adhesion. Consequently, no aluminum can deposit on the vacuum pump 20B which is formed of a dry pump having mechanical contact portions on the downstream side.

When the aluminum deposition is advanced, the trap apparatuses are disengaged from their corresponding branch exhaust pipes 22, and the heating coil 72 with aluminum thereon is drawn out of the insulating cylinder 34. In case the coil 72 and the cylinder 34 are bonded firmly to the separated aluminum, it is necessary only that the aluminum deposit be dissolved by drawing out the insulating cylinder 34 and immersing it in an aluminum dissolving solution, e.g., phosphoric acid solution.

As shown in FIG. 1, the two trap apparatuses 24 are arranged in parallel in the exhaust pipe 18. Therefore, the trap apparatuses 24 can be alternatively subjected to maintenance operation by switching the on-off valves 28 and 30 on the up- and downstream sides of the branch exhaust pipes 22, and the operation of the CVD apparatus need not be suspended during the maintenance work.

Figure 10:
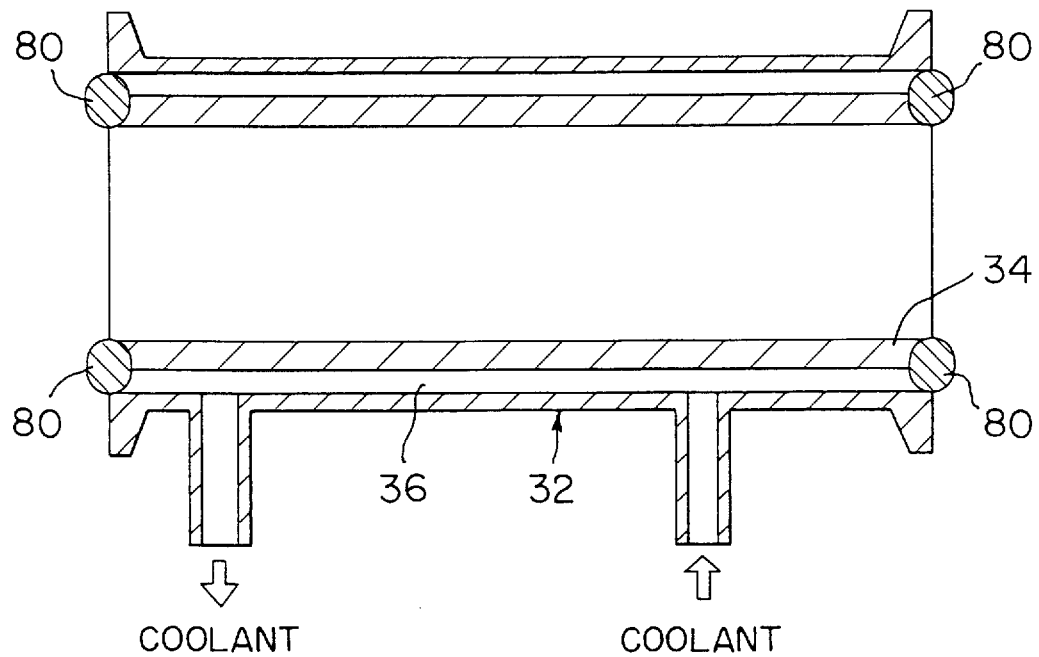
FIG. 10 is a diagram for illustrating a modification of cooling means.

In the embodiment described herein, the nitrogen gas is introduced into the exhaust gas after it is circulated through the refrigerant passage 36. Alternatively, however, a seal member 80 may be attached to each end of the refrigerant passage 36 so that the passage 36 is sealed against the exhaust gas passage, as shown in FIG. 10. In this case, a refrigerant outlet 82 is provided on the downstream, and cooling gas or water is circulated as a refrigerant in the passage. Alternatively, moreover, the refrigerant passage 36 may be entirely sealed to produce a vacuum state so that it serves as a vacuum insulating layer.

Figure 11:
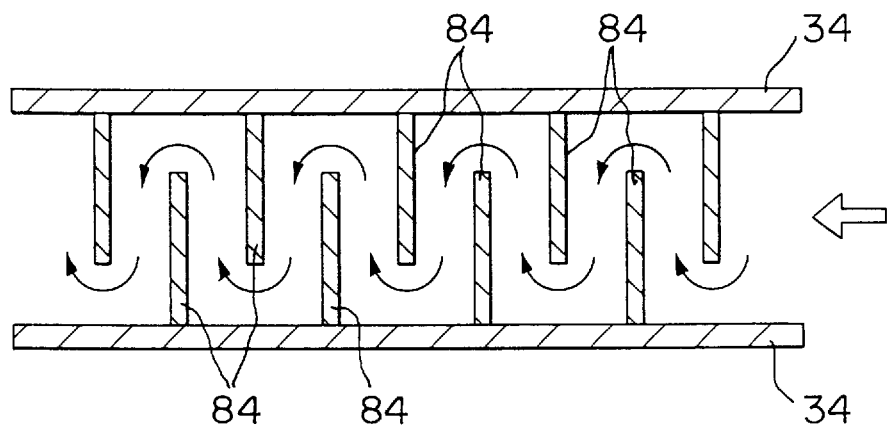
FIG. 11 is a schematic sectional view showing a modification of the heating trap means.
Figure 12:
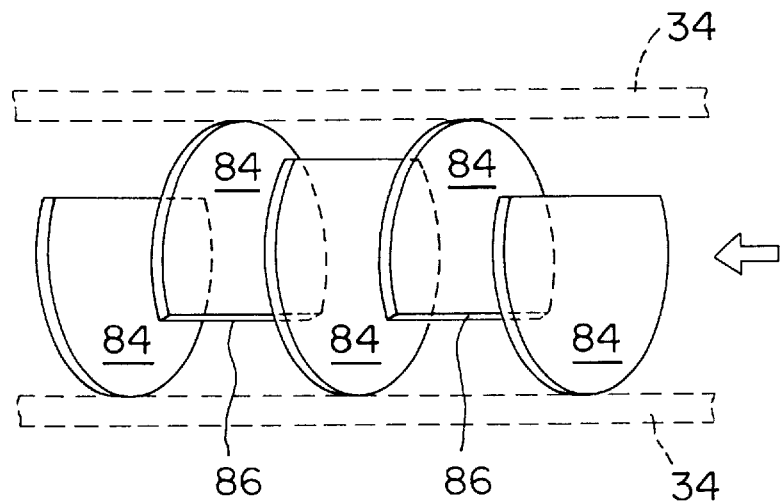
FIG. 12 is a perspective view of the heating trap means shown in FIG. 11.
Figure 13:
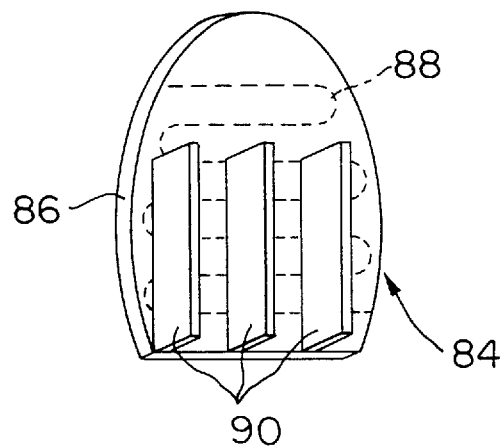
FIG. 13 is a perspective view showing a heating trap baffle plate fitted with fins.

In the embodiment described above, furthermore, the winding electric heating coil 72 is used as the heating trap means 64. However, the heating trap means 64 may be of any configuration provided that it can produce heat and decompose the unaffected process gas by touching it. As shown in FIGS. 11 to 13, for example, a plurality of heating trap baffle plates 84 may be arranged at predetermined pitches along the flow of the process gas.

Each trap baffle plate 84 is formed by depositing an electrically-conductive heat generating material, such as carbon or tungsten, on the surface of a substantially semi-circular nonconductive plate 86 of SiC or graphite by sputtering, or arranging a heating wire or coil 88 (see FIG. 13) on the surface of the plate 86. In order to increase the area of contact with the unaffected process gas, moreover, fins 90 may be set up on the plate surface, as shown in FIG. 13.

Preferably, the trap baffle plates 84 are mounted so that their respective notched ends are alternately situated in diametrically opposite positions, for example, whereby the exhaust gas flows in a zigzag line.

In the embodiment described above, moreover, an aluminum film is formed by using dimethyl aluminum hydride (DMAH). However, the present invention may be applied to any other cases in which diethyl aluminum hydride is used or films of metallic materials, such as tungsten, titanium, copper, etc., are formed by using a process gas which can be decomposed by heat. The process gases used for organic metallic compounds may include, for example, DMAH (dimethylaluminiumhydraido), TIBA (triisobutylaluminium), DMEAA(dimethylethylaminoaran), TMEAA(trimethylaminoaran), TMG(trimethylgallium), and trialkylphosphine.

As described above, the trap apparatuses according to the present invention and the unaffected process gas exhaust mechanism using the same can produce the following advantageous functions and effects.

In forming a film by using a process gas which can be decomposed by heat, the unaffected process gas in the exhaust gas can be pyrolytically decomposed and trapped substantially entirely.

By using the electric heating coil as the heating trap means so that it substantially covers the entire flow area, in particular, the efficiency of contact with the unaffected process gas can be improved to enhance the trapping efficiency.

Also, the cooling means can lower the temperature of the wall surface of the trapping passage container, thereby improving the safety of operation.

Moreover, the inert gas, such as nitrogen gas, is used as the cooling means, and is introduced into the exhaust gas after cooling. Thus, the inflammable gas produced by the pyrolysis of the unaffected process gas can be diluted to prevent explosion or the like, thereby improving the safety.

Moreover, the trap apparatuses of the present invention are located on the upstream side of the vacuum pump which includes mechanical contact portions, whereby the unaffected process gas can be removed securely. Thus, the vacuum pump cannot be adversely affected by separated metal.

Since the trap apparatuses are arranged in parallel with each other in the exhaust passage for alternative use, furthermore, they can be subjected to maintenance operation without suspending the operation of the process apparatus.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. A trap apparatus, which is inserted in a vacuum exhaust system sucking and discharging an exhaust gas from a process apparatus by a vacuum pump, for trapping a trap material contained in the exhaust gas, said trap apparatus comprising:

a trapping passage container inserted in an exhaust passage at the upstream side of the vacuum pump; and heating trap means, housed in the trapping passage container, for heating the exhaust gas to a temperature while the heating trap means is brought into contact with the exhaust gas flowing, wherein said heating trap means includes an electric heating coil formed in a shape of spiral so that a diameter thereof is gradually made larger and then is gradually made smaller, thereby subjecting the trap material in the exhaust gas to pyrolysis.

2. The trap apparatus according to claim 1, wherein said electric heating coil is arranged so as to cross perpendicularly with respect to the flow of the process gas in the trapping passage container.

3. The trap apparatus according to claim 1, wherein said trapping passage container includes cooling means for cooling the exhaust gas so as to prevent the wall surface of the trapping passage container from being heated by heat from the heating trap means.

4. The trap apparatus according to claim 3, wherein said cooling means includes a refrigerant passage, defined by the wall surface of the trapping passage container, for the circulation of a refrigerant.

5. The trap apparatus according to claim 4, wherein said refrigerant is formed of an inert gas and is introduced into the process gas after flowing through the refrigerant passage.

6. A vacuum exhaust system for sucking and discharging an exhaust gas from a process apparatus by a vacuum pump, said vacuum exhaust system comprising:

a trap apparatus including a trapping passage container inserted in an exhaust passage, at the upstream side of the vacuum pump, and heating trap means, housed in the trapping passage container, for heating the exhaust gas to a temperature while the heating trap means is brought into contact with the exhaust gas flowing, wherein said heating trap means includes an electric heating coil formed in a shape of spiral so that a diameter thereof is gradually made larger and then is gradually made smaller, thereby subjecting the trap material in the exhaust gas to pyrolysis.

7. The vacuum exhaust system according to claim 6, wherein said exhaust passage includes a plurality of branch exhaust passages arranged in parallel with one another, and said trap apparatus is inserted in each said branch exhaust passage for alternative use.

8. A process apparatus comprising:

a vacuum exhaust system for sucking and discharging exhaust gas from the process apparatus, the vacuum exhaust system including:

a vacuum pump, and a trap apparatus, the trap apparatus including a trapping passage container inserted in an exhaust passage, at the upstream side of the vacuum pump, and heating trap means, housed in the trapping passage container, for heating the exhaust gas to a temperature while the heating trap means is brought into contact with the exhaust gas flowing, wherein the heating trap means includes an electric heating coil formed in a shape of a spiral so that a diameter thereof is gradually made larger and then is gradually made smaller, thereby subjecting the trap material in the exhaust gas to pyrolysis.

9. The process apparatus according to claim 8, wherein the exhaust passage includes a plurality of branch exhaust passages arranged in parallel with one another, and such trap apparatus is inserted in each branch exhaust passage for alternative use.

* * * * *